United States Patent
Jang

(10) Patent No.: US 9,019,709 B2
(45) Date of Patent: Apr. 28, 2015

(54) PROTECTIVE CIRCUIT MODULE

(75) Inventor: Young-Cheol Jang, Yongin-si (KR)

(73) Assignee: Samsung SDI Co., Ltd., Gyeonggi-Do (KR)

(*) Notice: Subject to any disclaimer, the term of this patent is extended or adjusted under 35 U.S.C. 154(b) by 232 days.

(21) Appl. No.: 13/212,958

(22) Filed: Aug. 18, 2011

(65) Prior Publication Data

US 2012/0127682 A1 May 24, 2012

(30) Foreign Application Priority Data

Nov. 19, 2010 (KR) .................. 10-2010-0115666

(51) Int. Cl.
 *H05K 1/18* (2006.01)
 *H01M 2/34* (2006.01)
 *H01M 6/50* (2006.01)
 *H01M 10/42* (2006.01)
 *H05K 1/02* (2006.01)
 *H05K 1/16* (2006.01)
 *H05K 1/11* (2006.01)
 *H05K 1/14* (2006.01)

(52) U.S. Cl.
 CPC ............... *H01M 2/34* (2013.01); *H01M 2/348* (2013.01); *H01M 6/50* (2013.01); *H01M 10/425* (2013.01); *H01M 2200/10* (2013.01); *H05K 1/0201* (2013.01); *H05K 1/11* (2013.01); *H05K 1/141* (2013.01); *H05K 1/167* (2013.01)

(58) Field of Classification Search
 USPC .......................... 361/106, 713, 735, 792, 777; 429/61–62
 See application file for complete search history.

(56) References Cited

U.S. PATENT DOCUMENTS

| | | | |
|---|---|---|---|
| 6,487,084 B1* | 11/2002 | Chu et al. | 361/762 |
| 6,642,694 B2* | 11/2003 | Yamanaka et al. | 320/134 |
| 2007/0235547 A1* | 10/2007 | Janke et al. | 235/492 |
| 2009/0086398 A1 | 4/2009 | Jang | |
| 2009/0111013 A1* | 4/2009 | Jang | 429/163 |
| 2009/0122455 A1* | 5/2009 | Jang et al. | 361/106 |
| 2009/0123821 A1 | 5/2009 | Kim | |
| 2010/0159313 A1 | 6/2010 | Byun et al. | |
| 2011/0159323 A1* | 6/2011 | Kim | 429/7 |

FOREIGN PATENT DOCUMENTS

| | | | |
|---|---|---|---|
| JP | 2002-164039 A | 6/2002 | |
| JP | 2003-346757 A | 12/2003 | |
| JP | 2009-104888 A | 5/2009 | |

(Continued)

OTHER PUBLICATIONS

Daoqiang Lu; Wong, C.P., "Development of solder replacement conductive adhesives with stable resistance and superior impact performance," Adhesive Joining and Coating Technology in Electronics Manufacturing, 2000. Proceedings. 4th International Conference on, vol., no., pp. 110,116, 2000.*

(Continued)

*Primary Examiner* — Anatoly Vortman
*Assistant Examiner* — Jacob Crum
(74) *Attorney, Agent, or Firm* — Knobbe Martens Olson & Bear LLP

(57) ABSTRACT

A protection circuit board is disclosed. The protection circuit board includes a main printed circuit board and an auxiliary printed circuit board. In the auxiliary printed circuit board, a thermistor is electrically interposed between an external electrode terminal and auxiliary electrodes.

15 Claims, 4 Drawing Sheets

(56) References Cited

FOREIGN PATENT DOCUMENTS

| KR | 10-2004-0037547 A | 5/2004 |
| KR | 10-2009-0032377 A | 4/2009 |
| KR | 10-2009-0048854 A | 5/2009 |
| KR | 10-2010-0072917 A | 7/2010 |

OTHER PUBLICATIONS

Richard Perez, "How to Solder", Apr./May 2002, Home Power #88, p. 74.*
Korean Notice of Allowance dated Oct. 26, 2012 for Korean Patent Application No. KR 10-2010-0115666 which corresponds to captioned U.S. Appl. No. 13/212,958.
Japanese Office Action dated Feb. 26, 2013 for Japanese Patent Application No. JP 2011-009688 which shares priority of Korean Patent Application No. KR 10-2010-0115666 with captioned U.S. Appl. No. 13/212,958.
Korean Office Action dated Apr. 25, 2012 for Korean Patent Application No. KR 10-2010-0115666 which corresponds to captioned U.S. Appl. No. 13/212,958.
Japanese Final Rejection dated Aug. 6, 2013 for Japanese Patent Application No. JP 2011-009688 which shares priority of Korean Patent Application No. KR 10-2010-0115666 with captioned U.S. Appl. No. 13/212,958.

* cited by examiner

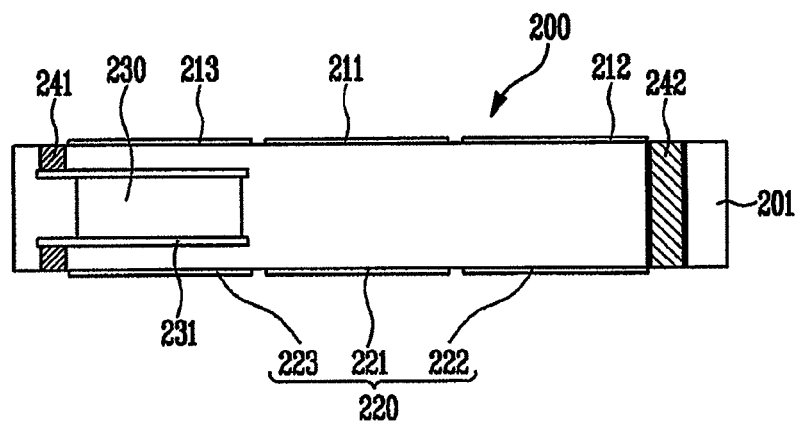
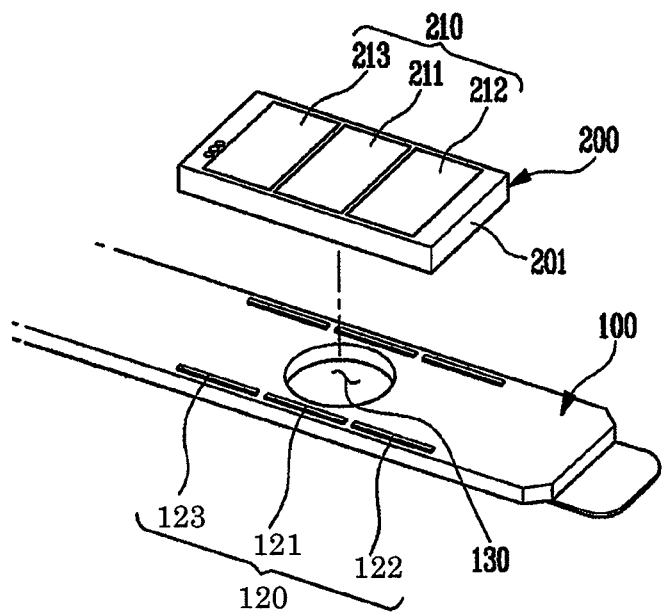

PROTECTIVE CIRCUIT MODULE

CROSS-REFERENCE TO RELATED APPLICATIONS

This application claims priority to and the benefit of Korean Patent Application No. 10-2010-0115666, filed on Nov. 19, 2010, in the Korean Intellectual Property Office, the entire content of which is incorporated herein by reference.

BACKGROUND

1. Field

The disclosed technology relates to a protection circuit module, and more particularly, to a protection circuit module in which an electrode terminal, a thermistor and the like are easily mounted using an auxiliary printed circuit board.

2. Description of the Related Technology

In general, a lithium-ion battery pack includes a core pack including a bare cell and a protection circuit module. The bare cell includes a positive electrode plate, a negative electrode plate, an electrolyte and a separator. The bare cell supplies power to an external electronic device.

The lithium-ion battery pack has a secondary protection device and a protection circuit, attached thereto, so as to protect the bare cell. The secondary protection device is attached between the bare cell and the protection circuit so as to protect the bare cell by acting on heat generation of the bare cell or an over-current occurrence.

As the safety of the bare cell has recently been emphasized, the secondary device, which conventionally protects the bare cell from the exterior of the bare cell, is built in a cell. For this reason, in a case where such a secondary device is mounted together on a printed circuit board having a protection circuit board mounted thereon, the size of a battery pack itself is increased.

SUMMARY OF CERTAIN INVENTIVE ASPECTS

One inventive aspect is a battery cell protection circuit module. The module includes a main printed circuit board having a main electrode pattern portion, where the pattern portion includes a plurality of main electrodes. The module also includes an auxiliary printed circuit board, with an auxiliary electrode pattern portion, including auxiliary electrodes corresponding to the main electrodes of the main electrode pattern portion. The auxiliary printed circuit board also includes an external electrode terminal electrically connected to the auxiliary electrodes, and a thermistor interposed between the external electrode terminal and the auxiliary electrodes, where the thermistor is electrically connected to the external electrode terminal and the auxiliary electrodes.

Another inventive aspect is an auxiliary printed circuit board configured to be connected to a main circuit board of a battery cell protection device. The auxiliary printed circuit board includes an auxiliary electrode, an external electrode terminal electrically connected to the auxiliary electrode, and a thermistor interposed between the external electrode terminal and the auxiliary electrode, where the thermistor is electrically connected to the external electrode terminal and the auxiliary electrode.

BRIEF DESCRIPTION OF THE DRAWINGS

The accompanying drawings, together with the specification, illustrate exemplary embodiments and, together with the description, serve to explain various aspects and principles of the embodiments.

FIG. 7 is a sectional view of an auxiliary printed circuit board viewed from the front according to some embodiments.

FIG. 8 is a sectional view showing the connection structure of main and auxiliary printed circuit boards according to some embodiments.

DETAILED DESCRIPTION OF CERTAIN INVENTIVE EMBODIMENTS

Figure 1:
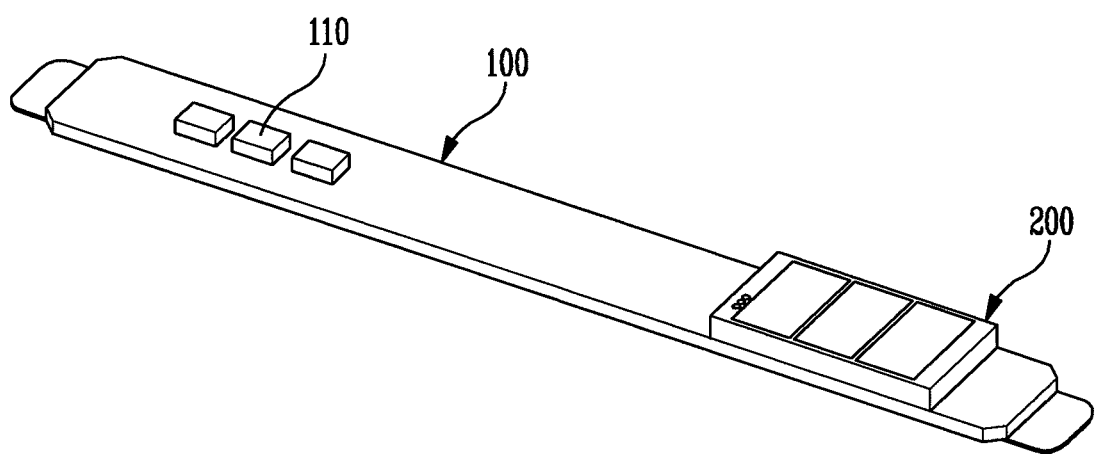
FIG. 1 is a perspective view of a protection circuit module according to an embodiment.

In the following detailed description, only certain exemplary embodiments have been shown and described, simply by way of illustration. As those skilled in the art would realize, the described embodiments may be modified in various ways, without departing from the spirit or scope of the present invention. Accordingly, the drawings and description are to be regarded as illustrative in nature and not restrictive. In addition, when an element is referred to as being "on" another element, it can be directly on the another element or it may be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals generally refer to like elements. When terms that indicate directions, such as to top, bottom left and right, are used without special notation, the terms indicate directions with the orientation represented in the drawings.

A protection circuit module according to various embodiments may be positioned on a main printed circuit board, on an auxiliary printed circuit board, or in some embodiments, one or more protection circuit module components are mounted on each of the boards. Hereinafter, components of the protection circuit module will be further described.

Figure 2:
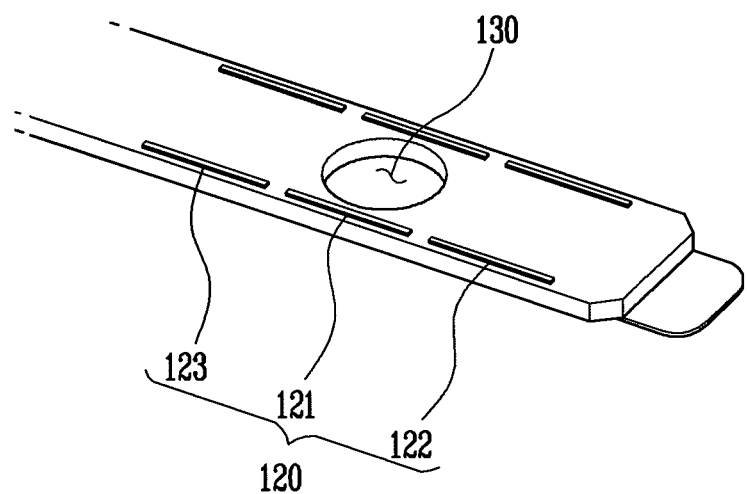
FIG. 2 is an enlarged view showing a main printed circuit board of FIG. 1, on which a main electrode pattern portion formed.

A main printed circuit board 100 will be described with reference to FIGS. 1 and 2. FIG. 1 is a perspective view of a protection circuit module according to an embodiment. FIG. 2 is an enlarged view showing the main printed circuit board of FIG. 1, on which a main electrode pattern portion formed.

As shown in FIG. 1, circuit components 110 of the protection circuit module for protecting a bare cell (not shown) are mounted on the main printed circuit board 100. Patterns are formed by performing an operation such as exposure or etching with respect to a copper clad laminated (CCL) plate formed by attaching a copper foil to one or both sides of an insulating substrate.

As shown in FIG. 2, a main electrode pattern portion 120 is divided into a main positive electrode pattern portion 122, a main negative electrode pattern portion 123 and a main ground pattern portion 121. In some embodiments, the main ground pattern portion 121 may be formed with a plurality of main ground pattern portions. The main electrode pattern portion 120 serves as connection terminals for a positive electrode, a negative electrode and a ground, and may, for example, be each provided as a pair of substantially identical electrode terminals or one or more substantially identical electrode terminals according to the current capacity or the like.

Meanwhile, the main electrode pattern portion 120 may be formed around a vent hole 130 formed on the main printed circuit board 100. In the manufacturing process of a secondary battery, an electrolyte is inserted through the vent hole 130, and the main electrode pattern portion 210 for mounting an auxiliary printed circuit board 200 which will be described later is formed on the vent hole 130, thereby saving space on the auxiliary printed circuit board 200. Thus, the auxiliary printed circuit board 200 can have reduced size.

Figure 3:
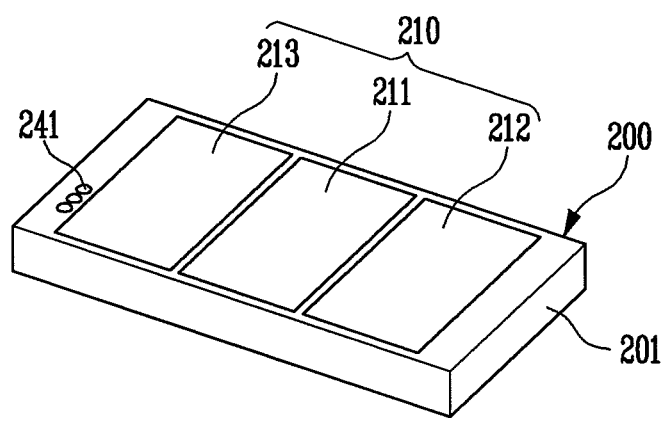
FIG. 3 is a perspective view of an auxiliary printed circuit board according to some embodiments.
Figure 4:
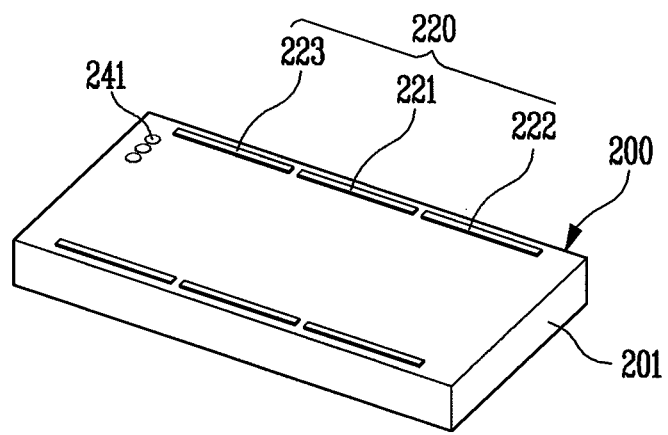
FIG. 4 is a bottom view of the auxiliary printed circuit board of FIG. 3, on which an auxiliary electrode pattern portion is formed.

The auxiliary printed circuit board 200 is described with reference to FIGS. 3 and 4. FIG. 3 is a perspective view of the auxiliary printed circuit board according to some embodiments. FIG. 4 is a bottom view of the auxiliary printed circuit board of FIG. 3, on which an auxiliary electrode pattern portion is formed.

An external electrode terminal 210 is provided on an upper surface of the auxiliary printed circuit board 200. The external electrode terminal 210 serves as a conductor for supplying electric power to an external device. The external electrode terminal 210 is divided into an external negative electrode terminal 213, an external ground terminal 211 and an external positive electrode terminal 212. In this embodiment, the external ground terminal 211 is formed with a plurality of external ground terminals of which number is identical to that of the main ground pattern portions 121 (see FIG. 2) described above.

As shown in FIG. 4, an auxiliary electrode pattern portion 220 corresponding to the main electrode pattern portion 120 (see FIG. 2) described above is formed on a bottom surface of the auxiliary printed circuit board 200. That is, like the main electrode pattern portion, the auxiliary electrode pattern portion 220 is divided into an auxiliary positive electrode pattern portion 222, an auxiliary negative electrode pattern portion 223 and an auxiliary ground pattern portion 221. In this embodiment, the number of auxiliary ground pattern portions 221 corresponds to that of the number of main ground patterns 121 (see FIG. 2). The connection structure between the auxiliary electrode pattern portion 220 and the external electrode terminal 210 is described below. In this embodiment, the auxiliary electrode pattern portion 220 is formed at a position that faces the external electrode terminal 210.

Figure 5:
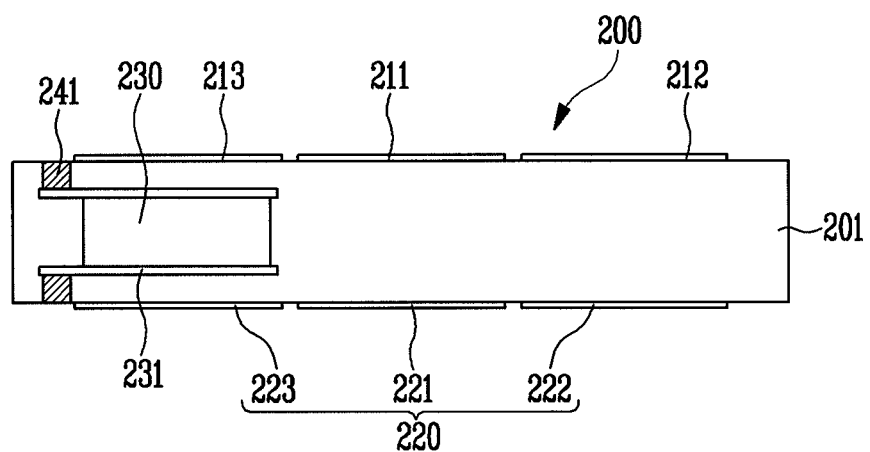
FIG. 5 is a sectional view of the auxiliary printed circuit board of FIG. 3, viewed from the front.
Figure 6:
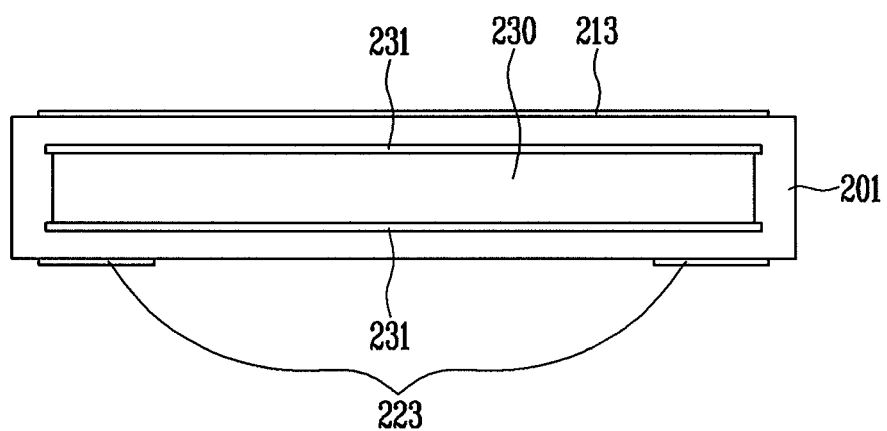
FIG. 6 is a sectional view of the auxiliary printed circuit board of FIG. 3, viewed from the side.

A thermistor 230 is described with reference to FIGS. 5 and 6. FIG. 5 is a cross-sectional view of the auxiliary printed circuit board of FIG. 3, viewed from the front. FIG. 6 is a cross-sectional view of the auxiliary printed circuit board of FIG. 3, viewed from the side.

The thermistor 230 is interposed between the external electrode terminal 210 and the auxiliary electrode pattern portion 220. Particularly, the thermistor 230 may be provided only between the external negative electrode terminal 213 and the auxiliary negative electrode pattern portion 223. The thermistor 230 may be built in the auxiliary printed circuit board 200 so as not to be exposed to the exterior of the auxiliary printed circuit board 200.

If the thermistor is exposed to the exterior, it may be oxidized or otherwise corroded because of its material property. Hence, if the thermistor is used for a single device, coating for oxidation prevention is necessarily performed on the thermistor. However, if the thermistor is built in and encapsulated by the auxiliary printed circuit board 200 as described in this embodiment, the thermistor is not exposed to the exterior, and hence coating for oxidation prevention is unnecessary. Thus, a manufacturing process of performing the coating for oxidation prevention can be omitted.

The thermistor may be a secondary protection device having a simple structure, and may be configured as a positive temperature coefficient (PTC) thermistor. The PTC thermistor is a semiconductor device in which electric resistance rapidly increases as temperature rises. Since the electric resistance increases as the temperature rises, the thermistor allows a circuit to be substantially open-circuited. Since the electric resistance decreases as the temperature falls, the thermistor allows a circuit to be substantially short-circuited. The PTC thermistor in some embodiments is switched in such a manner, so as to function as a secondary protection device.

Metal layers 231 are provided on top and bottom surfaces of the thermistor 230, respectively. The metal layers 231 serve as terminals of the thermistor 230 by contacting both ends of the thermistor. Therefore, the metal layers 231 may be formed of a metal having excellent electric conductivity. The metal layers 231 may be formed, for example, to contain a copper (Cu) component. This is particularly advantageous in terms of time and cost because in the manufacturing process of a printed circuit board, the metal layers 231 can be formed in the process of forming a copper foil using copper.

In order to improve the adhesion of the metal layers 231 to an insulating substrate 201, an adhesive layer (not shown) may be formed between the insulating substrate 201 and each of the metal layers respectively formed on the top and bottom surfaces of the thermistor 230. In this embodiment, the adhesive layer may be formed using an adhesive containing a component similar to the insulating substrate 201, such as epoxy resin. The adhesive containing a component similar to the insulating substrate 201 is used, so that the adhesion between the metal layer 231 and the insulating substrate 201 can be improved.

An electrical connection structure between the auxiliary electrode pattern portion 220 and the external electrode terminal 210 is described with reference to FIGS. 6 and 7. FIG. 6 is a cross-sectional view of the auxiliary printed circuit board of FIG. 3, viewed from the side. FIG. 7 is a cross-sectional view of an auxiliary printed circuit board viewed from the front.

The auxiliary electrode pattern portion 220 is connected to the external electrode terminal 210 through via holes (not shown). The via holes are formed by drilling a printed circuit board to make holes and then plating the interior of the holes. Patterns between the top and bottom of the printed circuit board are connected to each other through the via holes. The via holes are classified as a blind via hole, a through via hole, and the like. The blind via hole has one end which is difficult to observe when connecting outer and inner layers of a multi-layered printed circuit board. The through via hole refers to a via hole that passes through the top and bottom of a printed circuit board for the purpose of electrical connection between outer layers.

Blind via holes are formed between the auxiliary negative electrode pattern portion 223 and the thermistor 230 and between the thermistor 230 and the external negative electrode terminal 213 so as to electrically connect between the auxiliary negative electrode pattern portion 223 and the thermistor 230 and between the thermistor 230 and the external negative electrode terminal 213, respectively. Through via holes are formed between the auxiliary ground pattern portion 221 and the external ground terminal 211 and between the auxiliary positive electrode pattern portion 222 and the external positive electrode terminal 21 such as an example through via hole 242, so as to electrically connect the auxiliary ground pattern portion 221 to the external ground terminal 211, and the auxiliary positive electrode pattern portion 222 to the external positive electrode terminal 212. Each of the via holes may be plated with copper in consideration of the high electrical conductivity of copper.

The number of via holes is determined based on the amplitude of current. That is, if the amplitude of current is large, the number of via holes 241 is increased as shown in FIG. 3. Thus, an electrical passage is secured so that current can flow through the via holes 241 with low voltage drop.

The via holes are connected to the respective terminals of the external electrode terminal 210 through a circuit printed on the auxiliary printed circuit board 200. The via holes are connected to the respective pattern portions of the auxiliary electrode pattern portion 220 through the circuit printed on the auxiliary printed circuit board 200.

A connection structure between the main printed circuit board 100 and the auxiliary printed circuit board 200 is described with reference to FIGS. 7 and 8. FIG. 8 is a perspective view showing the connection structure of main and auxiliary printed circuit boards according to an embodiment.

A welding portion may be formed by solder paste between the main and auxiliary printed circuit board 100 and 200. The welding portion may be formed through a reflow process. The reflow process is a process of mounting circuit components on a printed circuit board so that the circuit components are electrically connected to the printed circuit board. In the reflow process, the circuit components are stably joined with the printed circuit board by melting the solder paste by the application of high-temperature heat.

The auxiliary printed circuit board 200 is mounted on the main printed circuit board 100 so that the bottom surface of the auxiliary printed circuit board 200 faces the top surface of the main printed circuit board 100. In this embodiment, pattern portions of a main electrode pattern portion 120 come in contact with pattern portions of an auxiliary electrode pattern portion 220 on the bottom surface of the auxiliary printed circuit board 200. A main positive electrode pattern portion 122 is electrically connected to an auxiliary positive electrode pattern portion 222, and a main negative electrode pattern portion 123 is electrically connected to an auxiliary negative electrode pattern portion 223. Also, a main ground pattern portion 121 is electrically connected to an auxiliary ground pattern portion 221. As a result, the pattern portions of the main electrode pattern portion 120 are electrically connected to corresponding terminals of an external electrode terminal 210.

While various aspects and principles have been described in connection with certain exemplary embodiments, it is to be understood that the invention is not limited to the disclosed embodiments, but, on the contrary, is intended to cover various modifications and equivalent arrangements.

What is claimed is:

1. A battery cell protection circuit module comprising:
   a main printed circuit board having a main electrode pattern portion, the pattern portion comprising a plurality of main electrodes;
   an auxiliary printed circuit board, comprising:
      an auxiliary electrode pattern portion, comprising auxiliary electrodes corresponding to the main electrodes of the main electrode pattern portion,
      an external electrode terminal electrically connected to the auxiliary electrodes, and
      a thermistor interposed between the external electrode terminal and the auxiliary electrodes, wherein the thermistor is electrically connected to the external electrode terminal and the auxiliary electrodes, wherein the thermistor is completely encapsulated within the auxiliary printed circuit board, such that no surface of the thermistor is exposed;
   wherein each of the main electrode pattern portion, the auxiliary electrode pattern portion and the external electrode terminal have a positive electrode, a negative electrode and a ground electrode;
   blind via holes that connect between the negative auxiliary electrode and the thermistor, and between the thermistor and the negative external terminal electrode, respectively; and
   through via holes that connect between the ground auxiliary electrode and the ground external terminal electrode, and between the positive auxiliary electrode and the positive external terminal electrode, respectively.

2. The protection circuit module according to claim 1, wherein the thermistor is interposed only between the negative auxiliary electrode and the negative external terminal electrode.

3. The protection circuit module according to claim 2, wherein each of the blind and through via holes is plated with copper.

4. The protection circuit module according to claim 2, wherein the number of blind and through via holes corresponds to the amplitude of current that passes through the blind and through via holes.

5. The protection circuit module according to claim 1, wherein metal layers forming terminals of the thermistor are on top and bottom surfaces of the thermistor, respectively.

6. The protection circuit module according to claim 5, wherein the metal layers comprise copper.

7. The protection circuit module according to claim 5, wherein an adhesive layer is formed within an insulating substrate of the auxiliary printed circuit board and between the insulating substrate of the auxiliary printed circuit board and each of the metal layers.

8. The protection circuit module according to claim 7, wherein the adhesive layer includes epoxy resin.

9. The protection circuit module according to claim 1, wherein the thermistor is a positive temperature coefficient (PTC) thermistor.

10. The protection circuit module according to claim 1, wherein the auxiliary electrodes are formed at positions corresponding to the terminals of the external electrode terminal.

11. The protection circuit module according to claim 1, wherein a welding portion is formed by solder paste between the main and auxiliary printed circuit boards.

12. An auxiliary printed circuit board configured to be connected to a main circuit board of a battery cell protection device, the auxiliary printed circuit board comprising:
   an auxiliary electrode;
   an external electrode terminal electrically connected to the auxiliary electrode;
   a thermistor interposed between the external electrode terminal and the auxiliary electrode, wherein the thermistor is electrically connected to the external electrode terminal and the auxiliary electrode, wherein the thermistor is completely encapsulated within the auxiliary printed circuit board, such that no surface of the thermistor is exposed, and wherein each of the auxiliary electrode and the external electrode terminal have a positive electrode, a negative electrode and a ground electrode;
   blind via holes that connect between the negative auxiliary electrode and the thermistor, and between the thermistor and the negative external terminal electrode, respectively; and through via holes that connect between the ground auxiliary electrode and the ground external terminal electrode, and between the positive auxiliary electrode and the positive external terminal electrode, respectively.

13. The auxiliary printed circuit board according to claim 12, further comprising:
plated via holes that connect the auxiliary electrodes and the thermistor and that connect the external electrode terminal and the thermistor.

14. The auxiliary printed circuit board according to claim 12, wherein the thermistor comprises a positive temperature coefficient (PTC) thermistor.

15. The auxiliary printed circuit board according to claim 12, wherein the auxiliary electrode and the external electrode terminal each comprise a plurality of electrodes.

* * * * *